United States Patent
Kim et al.

(10) Patent No.: US 12,129,547 B2
(45) Date of Patent: Oct. 29, 2024

(54) METHOD FOR PRODUCING OCTAHEDRON TRANSITION METAL DICHALCOGENIDES USING PLASMA

(71) Applicants: Research & Business Foundation Sungkyunkwan University, Suwon-si (KR); Ajou University Industry-Academic Cooperation Foundation, Suwon-si (KR)

(72) Inventors: Taesung Kim, Seoul (KR); Hyunho Seok, Anyang-si (KR); Jaehyun Lee, Bucheon-si (KR); Hyeong U Kim, Daejeon (KR); Kanade Vinit, Suwon-si (KR)

(73) Assignees: Research & Business Foundation Sungkyunkwan University, Suwon-si (KR); AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 0 days.

(21) Appl. No.: 17/232,450

(22) Filed: Apr. 16, 2021

(65) Prior Publication Data

US 2021/0395889 A1 Dec. 23, 2021

(30) Foreign Application Priority Data

Apr. 16, 2020 (KR) .................... 10-2020-0045904

(51) Int. Cl.
C23C 16/00 (2006.01)
C23C 16/06 (2006.01)
C23C 16/455 (2006.01)

(52) U.S. Cl.
CPC ........ *C23C 16/45536* (2013.01); *C23C 16/06* (2013.01)

(58) Field of Classification Search
CPC ..................................................... C23C 16/00
See application file for complete search history.

(56) References Cited

U.S. PATENT DOCUMENTS

2017/0088945 A1* 3/2017 Chueh ................. C23C 14/5866
2018/0105930 A1* 4/2018 Kang ................ C23C 16/45527
2018/0226248 A1* 8/2018 Jahangir ........... H01L 29/66742

FOREIGN PATENT DOCUMENTS

KR          10-1638121 B1      7/2016

OTHER PUBLICATIONS

"Low temperature deposition of 2D WS2 layers from WF6 and H2S precursors: impact of reducing agents", H. Bender, T. Conard, P. Verdonck, S. Van Elshocht, S. De Gendt, M. Heyns, K. Barla, I. Radua and A. Thean, Chem. Commun., 51, 15692-15695, (Year: 2015).*

(Continued)

*Primary Examiner* — Kelly M Gambetta
*Assistant Examiner* — Mohammad Mayy
(74) *Attorney, Agent, or Firm* — NSIP Law (57) ABSTRACT

The present disclosure relates to a method of producing octahedral transition metal dichalcogenides, including forming a transition metal layer on a substrate and injecting a chalcogenide-containing gas onto the substrate, on which the transition metal layer has been formed, together with a plasma treatment.

15 Claims, 7 Drawing Sheets

(56) References Cited

OTHER PUBLICATIONS

"Wafer-Scale and Low-Temperature Growth of 1T-WS2 Film for Efficient and Stable Hydrogen Evolution Reaction", Hyeong-U Kim, Vinit Kanade, Mansu Kim, Ki Seok Kim, Byeong-Seon An, Hyunho Seok, Dongmok Whang, Jae-Hyun Lee, and Taesung Kim, Small, 16, 1905000, (Year: 2020).*

"Low-Temperature Synthesis of Large-Scale Molybdenum Disulfide Thin Films Directly on a Plastic Substrate Using Plasma-Enhanced Chemical Vapor Deposition", Youngseok Kim, Changgu Lee, and Taesung Kim, Adv. Mater. 2015, 27, 5223-5229. (Year: 2015).*

"Plasma-Enhanced Atomic Layer Deposition of Two-Dimensional WS2 from WF6, H2 Plasma, and H2S", Iuliana Radu, Matty Caymax, and Annelies Delabie, Chem. Mater. 2017, 29, 2927-2938. (Year: 2017).*

"Enhanced catalytic activity of edge-exposed 1T phase WS2 grown directly on a WO3 nanohelical array for water splitting", Noho Lee, Yong Choi, Kyung-Yeon Doh, Jaewon Kim, Hyeji Sim, Donghwa Lee, Si-Young Choi, and Jong Kyu Kim, J. Mater. Chem. A, 7, 26378 (Year: 2019).*

Supporting information, "Enhanced catalytic activity of edge-exposed 1T phase WS2 grown directly on a WO3 nanohelical array for water splitting", Noho Lee, Yong Choi, Kyung-Yeon Doh, Jaewon Kim, Hyeji Sim, Donghwa Lee, Si-Young Choi, and Jong Kyu Kim, J. Mater. Chem. A, 7, 26378 (Year: 2019).*

Zhu, et al. "Argon plasma induced phase transition in monolayer MoS2." *Journal of the American Chemical Society* vol. 139 Issue 30; Jul. 21, 2017: pp. 10216-10219.

Morrish, et al. "Low-temperature synthesis of n-type WS2 thin films via H2S plasma sulfurization of WO3." *Chemistry of Materials* vol. 26 Issue 13; Jun. 11, 2014: pp. 3986-3992.

Korean Office Action issued on Oct. 13, 2021 in corresponding Korean Patent Application No. 10-2020-0045904 (6 pages in Korean).

* cited by examiner

METHOD FOR PRODUCING OCTAHEDRON TRANSITION METAL DICHALCOGENIDES USING PLASMA

CROSS-REFERENCE TO RELATED APPLICATION

This application claims the benefit under 35 USC 119(a) of Korean Patent Application No. 10-2020-0045904 filed on Apr. 16, 2020, in the Korean Intellectual Property Office, the entire disclosure of which is incorporated herein by reference for all purposes.

BACKGROUND

1. Field

The following disclosure relates to a method of producing octahedral transition metal dichalcogenides using plasma.

2. Description of Related Art

Examples of alternative energy sources include a fuel cell that produces water and energy by a reaction between hydrogen and oxygen. The fuel cell is a device that produces energy by an electrochemical reaction between fuel and an oxidizer and generally uses hydrogen as fuel and oxygen as an oxidizer.

The fuel cell has a high power generating efficiency in a range of 40% to 80%. Also, the fuel cell makes relatively little noise when generating electric power and requires a small area for generating electric power. Further, the fuel cell produces water as a by-product of the reaction and thus is non-harmful to the environment. Accordingly, the fuel cell has received a lot of attention as a next-generation energy device.

In order to commercialize the fuel cell, it is necessary to efficiently supply hydrogen and oxygen as reactants. A general method of obtaining hydrogen and oxygen is to electrolyze water. Accordingly, there is a need for study on the electrocatalyst for efficiently electrolyzing water.

As an electrocatalyst for electrolysis, transition metal dichalcogenides are being actively studied. The transition metal dichalcogenides are compounds of various transition metals of the periodic table and sulfur (S), selenium (Se) and tellurium (Te) except oxygen among the group 16 chalcogen elements, and have a plurality of structures, unlike graphene that is a representative two-dimensional material having a single structure. The transition metal dichalcogenides are next-generation nanomaterials whose electrical properties are changed into a conductor, a semiconductor, and an insulator by phase transition.

Particularly, a transition metal dichalcogenide with an octahedral structure (1T) has the properties of a conductor, unlike a semiconductor transition metal dichalcogenide with a hexagonal structure (2H). Therefore, the transition metal dichalcogenide with an octahedral structure (1T) has a high catalytic reactivity and a low resistance of the transition metal and thus has received a lot of attention as an energy electrochemical catalyst material that can replace expensive platinum catalysts.

However, the transition metal dichalcogenide with a metastable octahedral structure (1T) is phase transitioned to a transition metal dichalcogenide with a hexagonal structure (2H) which is stable in nature, and, thus, it is difficult to use.

Further, a metastable octahedral structure can be obtained only by a complicated and dangerous top-down approach such as electrochemical lithium intercalation and a method using an electron beam/laser. Also, it is not easy to obtain a large-area octahedral transition metal dichalcogenide having an industrially suitable and uniform thickness by a local top-down approach. Accordingly, there is a need for the development of a new method of producing an octahedral transition metal dichalcogenide by which a stable and large-area transition metal dichalcogenide with an octahedral structure (1T) can be produced.

Korean Patent No. 10-1638121, which is the background technology of the present disclosure, relates to a method and apparatus for forming a transition metal dichalcogenide and specifically relates to a method of forming a large-area transition metal dichalcogenide, including a process of supplying a chalcogenide gas to a transition metal source and a process of forming a transition metal dichalcogenide having a crystal structure by heating the transition metal source in a state where the chalcogenide gas is supplied, but does not describe an octahedral transition metal dichalcogenide, which is stable in nature, and a method of producing the same using plasma.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of producing octahedral transition metal dichalcogenides, includes forming a transition metal layer on a substrate and injecting a chalcogenide-containing gas onto the substrate together with a plasma treatment.

The transition metal layer may include a member selected from the group consisting of W, Mo, Cu, Ni, Sc, Ti, V, Cr, Mn, Fe, Co, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, Cn, and combinations thereof, but may not be limited thereto.

The forming the transition metal layer may be performed by a member selected from the group consisting of electron-beam evaporation, RF/DC sputtering, ion beam sputtering, chemical vapor deposition (CVD), low pressure chemical vapor deposition (LPCVD), plasma-enhanced chemical vapor deposition (PECVD), ion plating, and combinations thereof, but may not be limited thereto.

The plasma treatment may be a plasma enhanced chemical vapor deposition (PECVD) method.

The injecting of the chalcogenide-containing gas may be performed at a temperature in the range of 100° C. to 200° C., but may not be limited thereto.

The chalcogenide-containing gas may be injected together with a carrier gas, but may not be limited thereto.

The chalcogenide-containing gas may include a chalcogen selected from the group consisting of S, Se, Te, and combinations thereof, but may not be limited thereto.

The chalcogenide-containing gas may be supplied at 10 sccm to 30 sccm, but may not be limited thereto.

The octahedral transition metal dichalcogenides may have nanocrystals with a diameter of 5 nm to 10 nm, but may not be limited thereto.

The nanocrystals may include crystals with sizes regulated to nano-size by the plasma treatment, but may not be limited thereto.

The substrate may include a member selected from the group consisting of Si, $SiO_2$, Ge, GaN, AlN, GaP, InP, GaAs, SiC, Al$_2$O$_3$, LiAlO$_3$, MgO, glass, quartz, sapphire, graphite, graphene, metal foil, PEN (poly ethylene naphthalate), PET (poly ethylene terephthalate), and combinations thereof, but may not be limited thereto.

In another general aspect, octahedral transition metal dichalcogenides are prepared by the method disclosed above.

The octahedral transition metal dichalcogenides may have nanocrystals with a diameter of 5 nm to 10 nm, but may not be limited thereto.

In another general aspect, an electrode for hydrogen evolution reaction (HER) includes the octahedral transition metal dichalcogenides disclosed above.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for."

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Hereinafter, a method of producing octahedral transition metal dichalcogenides according to the present disclosure will be described in detail with reference to embodiments, examples and drawings. However, the present disclosure is not limited to these embodiments, examples and drawings.

Figure 1:
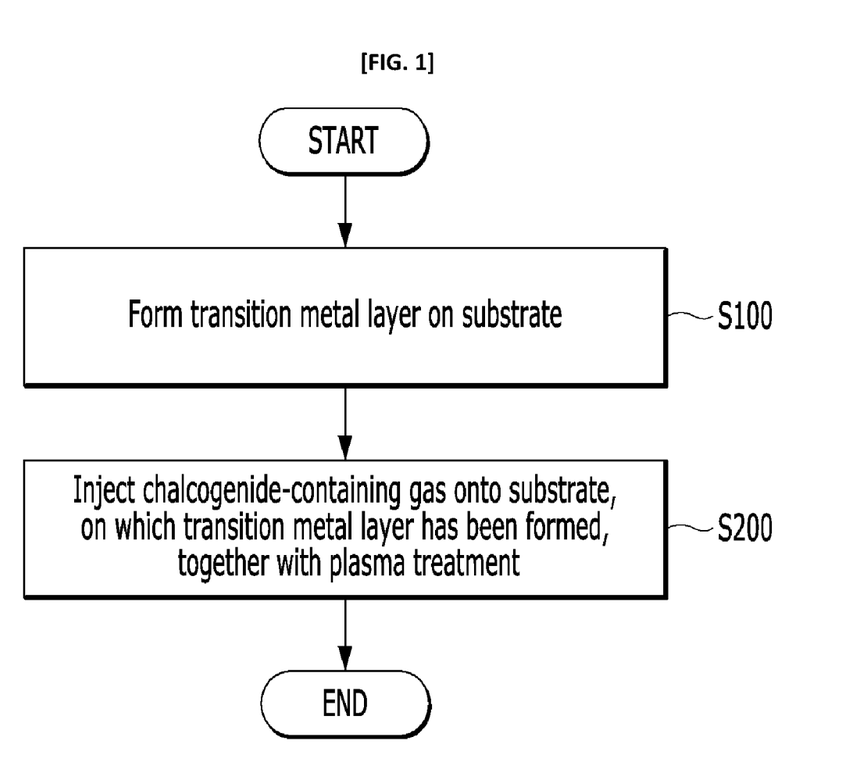
FIG. 1 is a flowchart showing an example of a method of producing an octahedral transition metal dichalcogenide according to an embodiment of the present disclosure.
Figure 2:
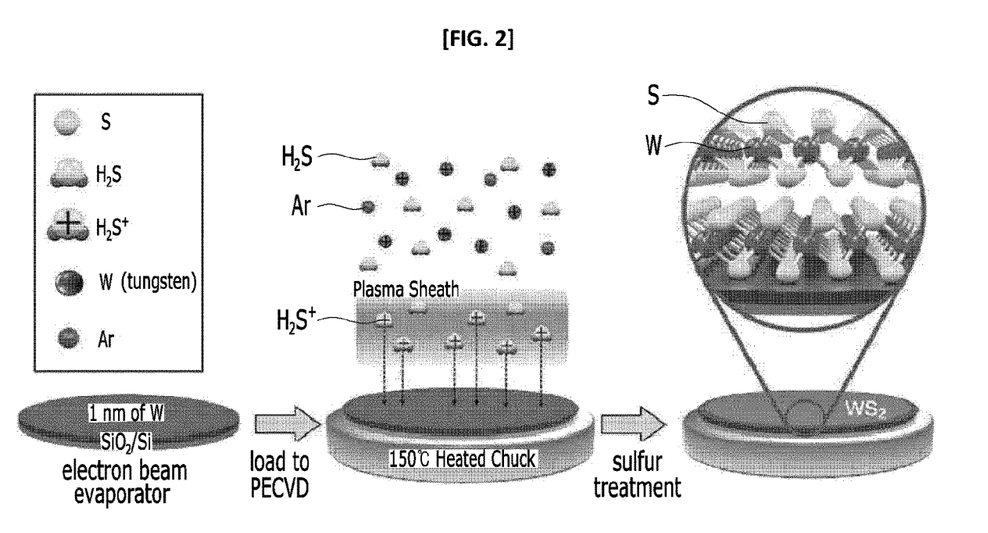
FIG. 2 is a schematic diagram showing examples of processes of producing the octahedral transition metal dichalcogenide according to an embodiment of the present disclosure.

FIG. 1 is a flowchart showing an example of a method of producing octahedral transition metal dichalcogenides according to an embodiment of the present disclosure, and FIG. 2 is a schematic diagram showing examples of processes of producing the octahedral transition metal dichalcogenide according to an embodiment of the present disclosure.

According to a first aspect of the present disclosure, there is provided a method of producing octahedral transition metal dichalcogenides, including a process of forming a transition metal layer on a substrate and a process of injecting a chalcogenide-containing gas onto the substrate, on which the transition metal layer has been formed, together with a plasma treatment.

A transition metal dichalcogenide with an octahedral structure (1T) has the properties of a conductor, unlike a semiconductor transition metal dichalcogenide with a hexagonal structure (2H). Therefore, the transition metal dichalcogenide with an octahedral structure (1T) has a high catalytic reactivity and a low resistance of the transition metal, and thus can be applied in various fields such as energy electrochemical catalyst. However, the transition metal dichalcogenide with a metastable octahedral structure (1T) is phase transitioned to a transition metal dichalcogenide with a hexagonal structure (2H) which is stable in nature, and, thus, it is difficult to use.

In the method of producing octahedral transition metal dichalcogenides, according to the present disclosure, the sizes of crystals are reduced to nano-sizes by using plasma, so that surface energy is increased as compared to when crystals have micron sizes. Therefore, it is possible to provide stable octahedral transition metal dichalcogenides, which are not phase transitioned to a hexagonal structure in nature.

Further, a top-down approach widely used for implementing a conventional metastable octahedral structure is complicated and dangerous, and unsuitable for large-area synthesis.

In the method of producing octahedral transition metal dichalcogenides according to the present disclosure, a bottom-up approach using plasma is used. Accordingly, it is possible to produce a large-area octahedral transition metal dichalcogenide having an industrially suitable and uniform thickness through a simple process with excellent economic feasibility.

To produce the octahedral transition metal dichalcogenides, first, a transition metal layer is formed on a substrate (S100).

According to an embodiment of the present disclosure, the transition metal layer may include a member selected from the group consisting of W, Mo, Cu, Ni, Sc, Ti, V, Cr, Mn, Fe, Co, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, Cn, and combinations thereof, but may not be limited thereto.

For example, the transition metal layer may contain tungsten (W), but may not be limited thereto.

Platinum (Pt), widely used as a conventional electrochemical catalyst, has high electrical conductivity and excellent catalyst characteristics but is expensive and limited in increasing the surface area on which the catalytic activity occurs, and thus cannot greatly increase the catalytic reaction rate.

In the method of producing octahedral transition metal dichalcogenides provided in the present disclosure, for example, tungsten (W) and molybdenum (Mo) are used as the transition metal layer and have relatively high performance as electrochemical catalysts as compared to other transition metals and, thus can be used as alternatives to platinum (Pt).

According to an embodiment of the present disclosure, the process of forming a transition metal layer may be performed by deposition. For example, the process of forming a transition metal layer may be performed by a member selected from the group consisting of electron-beam evaporation, RF/DC sputtering, ion beam sputtering, chemical vapor deposition (CVD), low pressure chemical vapor deposition (LPCVD), plasma enhanced chemical vapor deposition (PECVD), ion plating, and combinations thereof, but may not be limited thereto.

For example, the process of forming a transition metal layer may be performed by electron-beam evaporation, but may not be limited thereto.

Then, a chalcogenide-containing gas is injected onto the substrate, on which the transition metal layer has been formed, together with a plasma treatment (S200).

According to an embodiment of the present disclosure, the process of injecting a chalcogenide-containing gas may be performed at a temperature in the range of about 100° C. to about 200° C., but may not be limited thereto.

In a non-limiting example, the process of injecting a chalcogenide-containing gas may be performed at a temperature of about 150° C., but may not be limited thereto.

Chemical vapor deposition (CVD) is a method for depositing a product on the surface of a substrate by reacting a compound in a gaseous state with the heated surface of the substrate. Due to less contribution of high-speed particles during deposition, the surface of the substrate is less damaged. Therefore, CVD is currently one of the most widely and commercially used thin-film forming methods. Particularly, plasma enhanced chemical vapor deposition (PECVD) converts a reaction gas into plasma using high speed electrons and thus promotes a reaction and greatly lowers a process temperature as compared to thermal CVD.

If the process of injecting a chalcogenide-containing gas is performed at a high temperature in the range of about 850° C. to about 980° C., as in a typical CVD method, a transition metal dichalcogenide with a hexagonal structure (2H) is mainly produced. In the method of producing octahedral transition metal dichalcogenides provided in the present disclosure, plasma enhanced chemical vapor deposition (PECVD) is used to greatly lower a process temperature to a relatively low temperature in the range of about 100° C. to about 200° C. so that a transition metal dichalcogenide with an octahedral structure (1T) can be produced.

According to an embodiment of the present disclosure, the chalcogenide-containing gas may be injected together with a carrier gas, but may not be limited thereto.

For example, the carrier gas may be argon (Ar), but may not be limited thereto.

Argon (Ar), which is an inactive gas, is an inert gas and can be more easily ionized than hydrogen sulfide ($H_2S$) and randomly moves inside plasma. Here, non-ionized hydrogen sulfide ($H_2S$) collides with argon (Ar) and gives an electron to be ionized into hydrogen sulfide ions ($H_2S^+$). Therefore, when argon (Ar) is injected at a predetermined percentage, more hydrogen sulfide ions ($H_2S^+$) can be obtained. Therefore, hydrogen sulfide ions ($H_2S^+$) can be bonded to tungsten (W) atoms.

According to an embodiment of the present disclosure, the chalcogenide-containing gas may include a chalcogen selected from the group consisting of S, Se, Te, and combinations thereof, but may not be limited thereto.

For example, the chalcogenide-containing gas may be hydrogen sulfide ($H_2S$), but may not be limited thereto.

Hydrogen sulfide ($H_2S$) generates hydrogen gas as a by-product and can be removed by substitution with water ($H_2O$) and oxygen ($O_2$) by using a scrubber, which ensures excellent safety in production processes.

According to an embodiment of the present disclosure, the chalcogenide-containing gas may be supplied from about 10 sccm to about 30 sccm, but may not be limited thereto.

According to an embodiment of the present disclosure, the octahedral transition metal dichalcogenides may have nanocrystals with a diameter of from about 5 nm to about 10 nm, but may not be limited thereto.

According to an embodiment of the present disclosure, the nanocrystals may include crystals whose sizes are regulated to nano-size by the plasma treatment, but may not be limited thereto.

A transition metal dichalcogenide with a metastable octahedral structure (1T) is phase transitioned to a transition metal dichalcogenide with a hexagonal structure (2H) which is stable in nature. Therefore, in order to use octahedral transition metal dichalcogenides, it is necessary to produce octahedral transition metal dichalcogenide, which are not phase transitioned in nature.

In the method of producing octahedral transition metal dichalcogenides provided in the present disclosure, the sizes of crystals are reduced to nano-size by using plasma, and, thus, free energy becomes low, and the structure becomes stable.

More specifically, hydrogen sulfide ($H_2S^+$) and argon ($Ar^+$) ionized inside plasma sheath accelerate toward the substrate, which is electrically neutral, and collide with the substrate, which causes bombardment, and, thus, a tungsten (W) metal layer is synthesized with tungsten disulfide. Then, crystallization and bombardment are repeated so that the sizes of crystals are reduced to uniform nano-sizes. Therefore, it is possible to provide stable octahedral transition metal dichalcogenides which are not phase transitioned to a hexagonal structure.

According to an embodiment of the present disclosure, the substrate may include a member selected from the group consisting of Si, $SiO_2$, Ge, GaN, AlN, GaP, InP, GaAs, SiC, $Al_2O_3$, $LiAlO_3$, MgO, glass, quartz, sapphire, graphite, graphene, metal foil, PEN (poly ethylene naphthalate), PET (poly ethylene terephthalate), and combinations thereof, but may not be limited thereto.

According to a second aspect of the present disclosure, there are provided octahedral transition metal dichalcogenides prepared by the method according to the first aspect of the present disclosure.

Detailed descriptions of the octahedral transition metal dichalcogenides according to the second aspect of the present disclosure, which overlap with those of the first aspect of the present disclosure, are omitted hereinafter, but the descriptions of the first aspect of the present disclosure may be identically applied to the second aspect of the present disclosure, even though they are omitted hereinafter.

According to an embodiment of the present disclosure, the octahedral transition metal dichalcogenides may have nanocrystals with a diameter of from about 5 nm to about 10 nm, but may not be limited thereto.

According to a third aspect of the present disclosure, there is provided an electrode for hydrogen evolution reaction (HER), including the octahedral transition metal dichalcogenides according to the second aspect of the present disclosure.

Detailed descriptions of the electrode for hydrogen evolution reaction (HER), including octahedral transition metal dichalcogenides according to the third aspect of the present disclosure, which overlap with those of the second aspect of the present disclosure, are omitted hereinafter, but the descriptions of the second aspect of the present disclosure may be identically applied to the third aspect of the present disclosure, even though they are omitted hereinafter.

A transition metal dichalcogenide with an octahedral structure (1T), according to the present disclosure, has the properties of a conductor unlike a semiconductor transition metal dichalcogenide with a hexagonal structure (2H). Therefore, the transition metal dichalcogenide with an octahedral structure (1T) has a high catalytic reactivity and a low resistance of the transition metal and thus can be applied in various fields such as energy electrochemical catalyst.

Further, the transition metal dichalcogenide with an octahedral structure (1T), according to the present disclosure, has nano-sized crystals, and, thus, the number of interfaces increases. Therefore, the electrochemical efficiency increases. Accordingly, the transition metal dichalcogenide with an octahedral structure (1T) according to the present disclosure can be usefully used as an electrochemical catalyst.

Hereinafter, the present disclosure will be described in more detail with reference to examples. The following examples are provided only for explanation, but do not intend to limit the scope of the present disclosure.

[Example] Preparation of Octahedral Tungsten Disulfide ($1T-WS_2$)

A 4-inch tungsten wafer was deposited to a thickness of 1 nm on a silicon oxide substrate having a thickness of 300 nm and a plastic substrate (polyimide and Teflon) by an electron beam evaporator at a maintained deposition rate of 0.1 Å $min^{-1}$ in a high vacuum condition ($1\times10^{-5}$ mTorr).

Then, the substrates coated with tungsten were loaded to a plasma enhanced chemical vapor deposition (PECVD) chamber, and the chamber was evacuated for 10 minutes in a high vacuum condition (about 1 mTorr) to remove impurities and residues on the substrate. Then, an argon (Ar) gas was injected into the chamber at 20 mTorr for 10 min.

Thereafter, hydrogen plasma treatment was performed for 15 minutes at a chamber pressure of 200 mTorr and a plasma power of 200 W to remove a natural oxide film on the tungsten layer.

Then, the substrates coated with tungsten were heated to 150° C. in the argon (Ar) atmosphere. After the temperature reached a reaction temperature (150° C.), the substrates coated with tungsten were treated for 90 minutes with hydrogen sulfide ($H_2S$) and argon (Ar) plasma at a flow rate of 10:10 sccm, a chamber pressure of 100 mTorr, and a plasma power of 550 W to prepare an octahedral tungsten disulfide ($1T-WS_2$).

Figure 3:
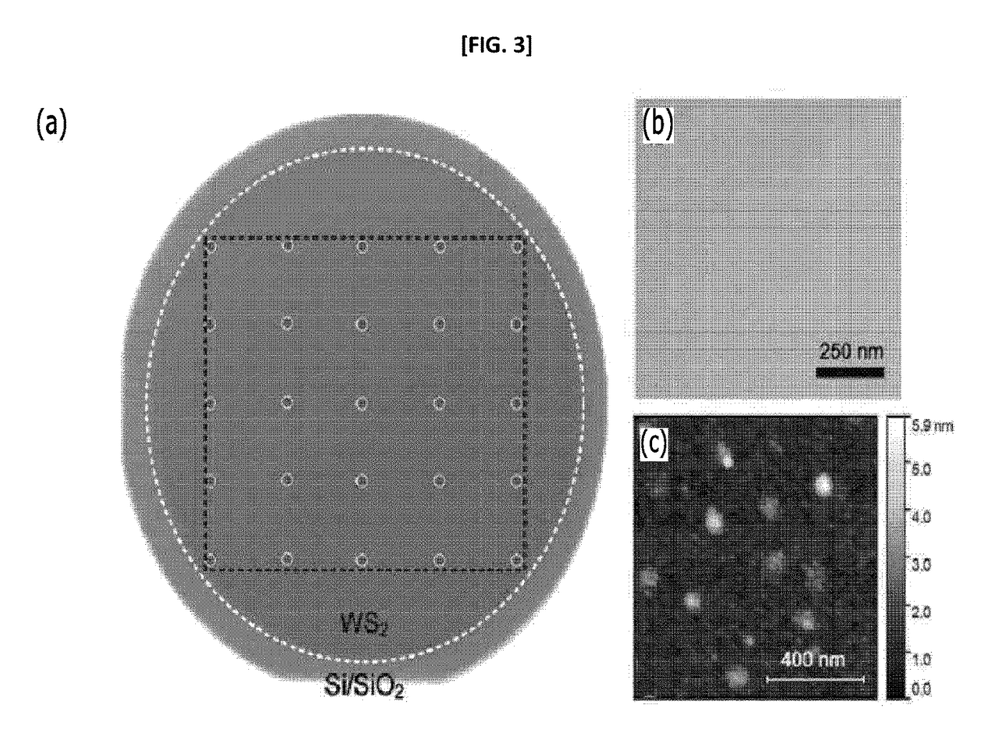
FIG. 3 shows images of an example of an octahedral transition metal dichalcogenide prepared according to an example of the present disclosure.

(a) of FIG. 3 shows an octahedral transition metal dichalcogenide prepared according to an example of the present disclosure. It can be seen from (a) of FIG. 3 that a large-area octahedral tungsten disulfide (1T-WS$_2$) was prepared to a 4-inch wafer size.

(b) of FIG. 3 is an optical microscopy image of the octahedral transition metal dichalcogenide prepared according to an example of the present disclosure. It can be seen from (b) of FIG. 3 that the prepared large-area octahedral tungsten disulfide (1T-WS$_2$) was uniform.

(c) of FIG. 3 is an image showing the surface roughness of the octahedral transition metal dichalcogenide prepared according to an example of the present disclosure. The image was obtained by atomic force microscopy (AFM). The topology of the prepared octahedral tungsten disulfide (1T-WS$_2$) can be seen from (c) of FIG. 3.

Figure 4:
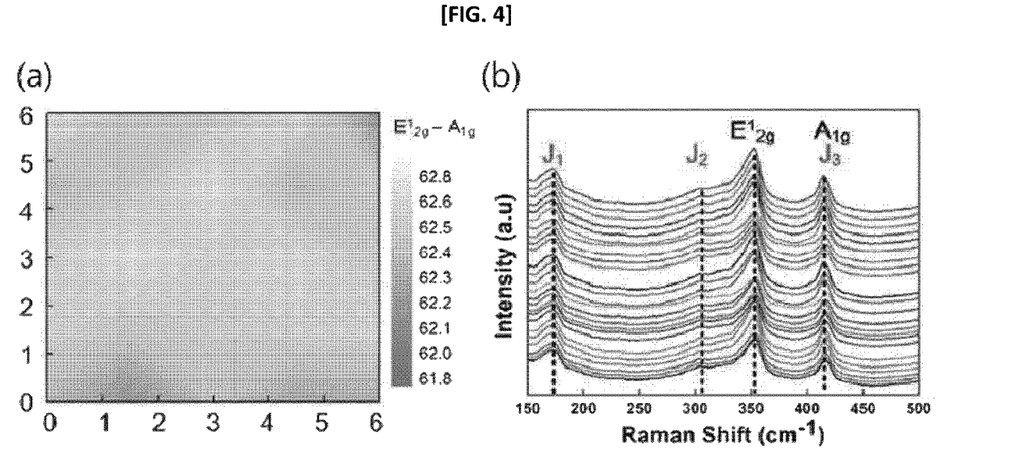
FIG. 4 shows images of an example of an octahedral transition metal dichalcogenide analyzed by Raman spectroscopy according to an example of the present disclosure.

FIG. 4 shows images of an octahedral transition metal dichalcogenide analyzed by Raman spectroscopy according to an example of the present disclosure.

(a) of FIG. 4 is an image showing the difference in $E^1_{2g}$-$A_{1g}$ by using Raman spectroscopy, and (b) of FIG. 4 shows Raman spectra of the octahedral transition metal dichalcogenide according to an example of the present disclosure.

It can be seen from FIG. 4 that tungsten disulfide has Raman spectra of $E^1_{2g}$ and $A_{1g}$, but only the octahedral tungsten disulfide (1T-WS$_2$) further has $J_1$, $J_2$ and $J_3$ peaks and thus is distinguished from a hexagonal tungsten disulfide (Comparative Example, 2H-WS$_2$).

It can be seen from FIG. 3 and FIG. 4 that a uniform large-area octahedral tungsten disulfide (1T-WS$_2$) was actually prepared.

Figure 5:
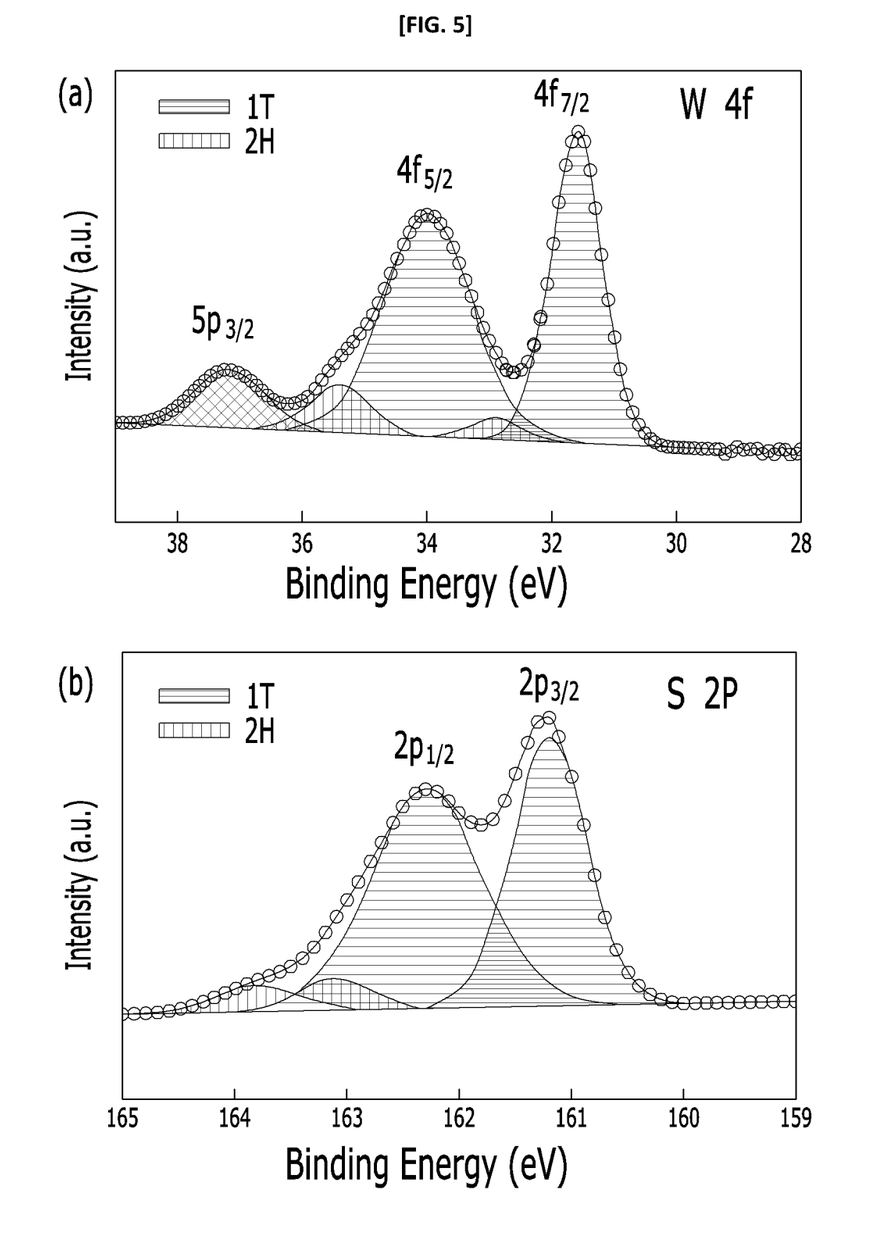
FIG. 5 shows images of an example of an octahedral transition metal dichalcogenides analyzed by X-ray photoelectron spectroscopy according to an example of the present disclosure.

FIG. 5 shows images of octahedral transition metal dichalcogenides analyzed by X-ray photoelectron spectroscopy according to an example of the present disclosure. It can be seen from FIG. 5 that binding energy appears at different positions in the W4f and S2p regions of the octahedral tungsten disulfide (1T-WS$_2$), which is distinguished from the hexagonal tungsten disulfide (Comparative Example, 2H-WS$_2$).

Figure 6:
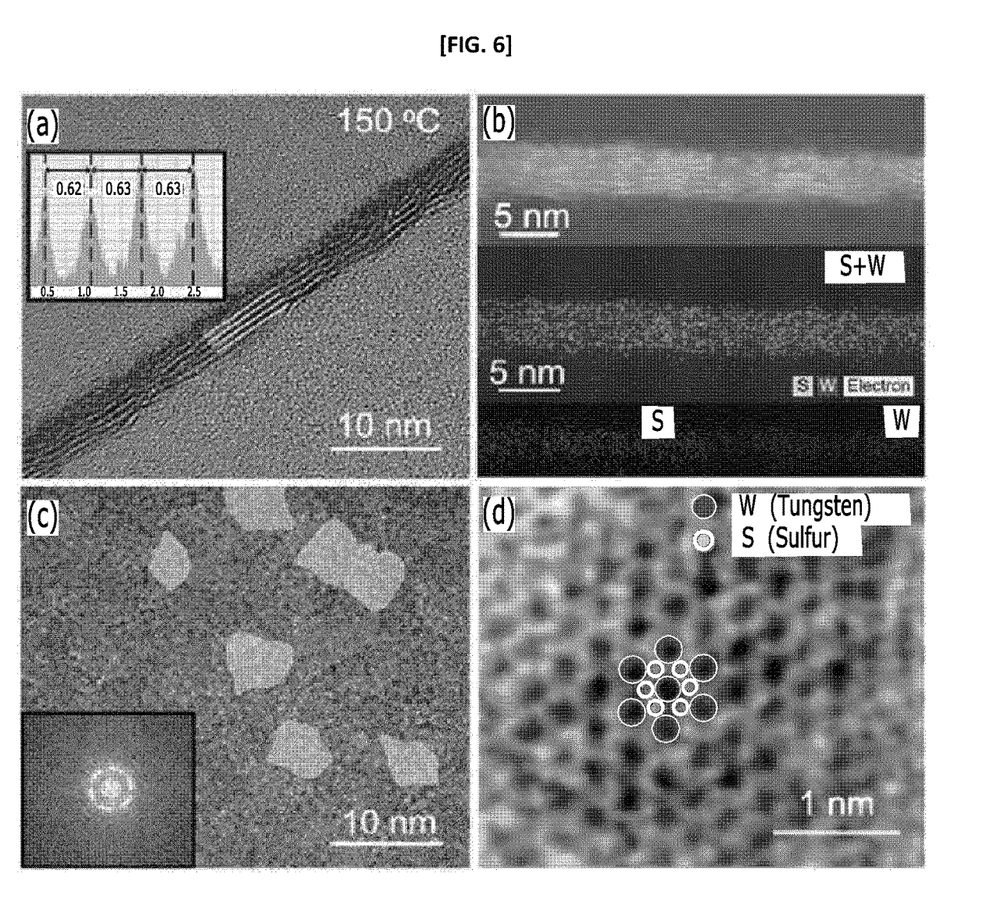
FIG. 6 shows TEM images of an example of an octahedral transition metal dichalcogenide according to an example of the present disclosure.

(a) of FIG. 6 is a high resolution transmission electron microscopy (HR-TEM) image of an octahedral transition metal dichalcogenide prepared according to an example of the present disclosure. An octahedral (1T) atomic structure of the octahedral tungsten disulfide (1T-WS$_2$) can be seen from (a) of FIG. 6.

(b) of FIG. 6 shows an image of the octahedral transition metal dichalcogenide prepared according to an example of the present disclosure as analyzed by electron energy loss spectroscopy (EELS). It can be seen from (b) of FIG. 6 that tungsten (W) and sulfur (S) are uniformly distributed over the whole area of the prepared octahedral tungsten disulfide (1T-WS$_2$).

(c) of FIG. 6 is an in-plane high resolution transmission electron microscopy (In-plane HR-TEM) image of the octahedral transition metal dichalcogenide prepared according to an example of the present disclosure. Nano-sized crystals of the prepared octahedral tungsten disulfide (1T-WS$_2$) can be seen from (c) of FIG. 6.

(d) of FIG. 6 is an aberration correction scanning transmission electron microscopy (STEM) image of the octahedral transition metal dichalcogenide prepared according to an example of the present disclosure. It can be seen from (d) of FIG. 6 that sulfur (S) atoms occupy the central hollow portion of a hexagonal pattern of tungsten (W) which is identical to the atomic arrangement of a monogonal octahedral phase.

Comparative Example

A 4-inch tungsten wafer was deposited to a thickness of 1 nm on a silicon oxide substrate having a thickness of 300 nm and a plastic substrate (polyimide and Teflon) by an electron beam evaporator at a maintained deposition rate of 0.1 Å min$^{-1}$ in a high vacuum condition (1×10$^{-5}$ mTorr).

Then, the substrates coated with tungsten were loaded to a plasma chemical vapor deposition (PECVD) chamber, and the chamber was evacuated for 10 minutes in a high vacuum condition (about 1 mTorr) to remove impurities and residues on the substrate. Then, an argon (Ar) gas was injected into the chamber.

Thereafter, hydrogen plasma treatment was performed for 15 minutes at a chamber pressure of 200 mTorr and a plasma power of 200 W to remove a natural oxide film on the tungsten layer.

Then, the substrates coated with tungsten were heated to 300° C. in the argon (Ar) atmosphere. After the temperature reached a reaction temperature (300° C.), the substrates coated with tungsten were treated for 90 minutes with hydrogen sulfide (H$_2$S) and argon (Ar) plasma at a flow rate of 10:10 sccm, a chamber pressure of 100 mTorr, and a plasma power of 550 W to prepare a hexagonal tungsten disulfide (2H-WS$_2$) as Comparative Example.

[Test Example]

Figure 7:
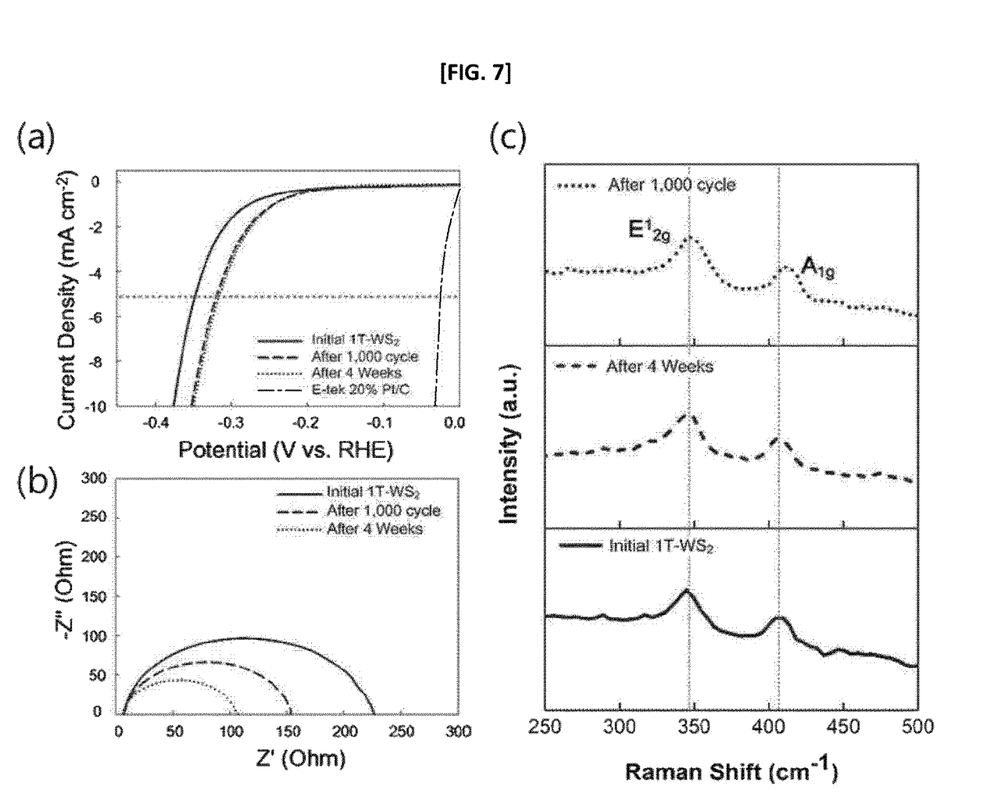
FIG. 7 shows graphs showing an example of the hydrogen evolution reaction efficiency of an octahedral transition metal dichalcogenide according to an example of the present disclosure.

FIG. 7 shows graphs showing the hydrogen evolution reaction efficiency of an octahedral transition metal dichalcogenide according to an example of the present disclosure.

Specifically, (a) of FIG. 7 is a graph showing polarization curves for the electrochemical efficiency of the prepared octahedral tungsten disulfide (Initial 1T-WS$_2$), tungsten disulfide after 1,000 cycles (After 1,000 cycle), and tungsten disulfide after 4 weeks (After 4 weeks) during hydrogen evolution reaction.

(b) of FIG. 7 is an electrochemical impedance spectroscopy graph showing the electrochemical efficiency of the prepared octahedral tungsten disulfide (Initial 1T-WS$_2$), tungsten disulfide after 1,000 cycles (After 1,000 cycle), and tungsten disulfide after 4 weeks (After 4 weeks) during hydrogen evolution reaction.

It can be seen from (a) of FIG. 7 and (b) of FIG. 7 that even when the prepared octahedral tungsten disulfide (Initial 1T-WS$_2$) was exposed to normal temperature and pressure for 4 weeks after 1,000 cycles (1 day), the measurement result of performance was not changed, and, thus, the metastable octahedral tungsten disulfide (1T-WS$_2$) was stabilized by nano-sized crystals after a certain change. It can be seen that this is because of the structural stability, which can be obtained when the sizes of crystals are reduced to nano-size.

Also, it can be seen that since the prepared octahedral tungsten disulfide (1T-WS$_2$) had nano-sized crystals, the number of interfaces increased, and the electrochemical efficiency increased.

(c) of FIG. 7 is a Raman spectroscopy graph comparing and analyzing Raman spectra of the prepared octahedral tungsten disulfide (Initial 1T-WS$_2$), tungsten disulfide after 1,000 cycles (After 1,000 cycle), and tungsten disulfide after 4 weeks (After 4 weeks).

It can be seen from (c) of FIG. 7 that there was no change in peaks of $E^1_{2g}$ and $A_{1g}$, and, thus, the prepared octahedral tungsten disulfide (1T-WS$_2$) had the same vibrational spectrum and structure even after 4 weeks.

It can be seen from FIG. 7 that since the prepared octahedral tungsten disulfide (1T-WS$_2$) had nano-sized crystals, it was maintained in a stable state without phase transition.

According to the aspects of the present disclosure, a conventional octahedral transition metal dichalcogenide is phase transitioned to a transition metal dichalcogenide with a hexagonal structure which is stable in nature, and, thus, it is difficult to use, but in the method of producing octahedral transition metal dichalcogenides according to the present disclosure, the sizes of crystals are reduced to nano-size by using plasma. Therefore, it is possible to provide stable octahedral transition metal dichalcogenides which are not phase transitioned to a hexagonal structure.

Also, in the method of producing octahedral transition metal dichalcogenides according to the present disclosure, a top-down approach widely used for implementing a conventional metastable octahedral structure is not used, but a new production method using a bottom-up approach using plasma is provided. Accordingly, it is possible to produce a large-area octahedral transition metal dichalcogenide having an industrially suitable and uniform thickness through a simple process with excellent economic feasibility.

Further, a transition metal dichalcogenide with an octahedral structure (1T), according to the present disclosure, has properties of a conductor unlike a semiconductor transition metal dichalcogenide with a hexagonal structure (2H). Therefore, the transition metal dichalcogenide with an octahedral structure (1T) has a high catalytic reactivity and a low resistance of the transition metal and thus can be applied in various fields such as energy electrochemical catalyst.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of producing an octahedral transition metal dichalcogenide, comprising:
    forming a transition metal layer on a substrate; and
    injecting a chalcogenide-containing gas onto the substrate together with a plasma treatment,
    wherein the transition metal layer comprises a member selected from the group consisting of W, Cu, Ni, Sc, Ti, V, Cr, Mn, Fe, Co, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, Cn, and combinations thereof;
    the chalcogenide-containing gas is supplied at 10 sccm to 30 sccm; and
    the injecting of the chalcogenide-containing gas is performed at a temperature in a range of 100° C. to 200° C., and
    wherein the chalcogenide-containing gas forms argon ions (Ar$^+$) and hydrogen sulfide ions (H$_2$S$^+$) during the plasma treatment.

2. The method of claim 1, wherein the forming of the transition metal layer is performed by a member selected from the group consisting of electron-beam evaporation, RF/DC sputtering, ion beam sputtering, chemical vapor deposition (CVD), low pressure chemical vapor deposition (LPCVD), plasma enhanced chemical vapor deposition (PECVD), ion plating, and combinations thereof.

3. The method of claim 1, wherein the plasma treatment is a plasma enhanced chemical vapor deposition (PECVD) method.

4. The method of claim 1,
    wherein the chalcogenide-containing gas is injected together with a carrier gas.

5. The method of claim 1,
    wherein the octahedral transition metal dichalcogenide comprises nanocrystals with a diameter of 5 nm to 10 nm.

6. The method of claim 5,
    wherein the nanocrystals include crystals with sizes regulated to nano-size by the plasma treatment.

7. The method of claim 1,
    wherein the substrate includes a member selected from the group consisting of Si, SiO$_2$, Ge, GaN, AlN, GaP, InP, GaAs, SiC, Al$_2$O$_3$, LiAlO$_3$, MgO, glass, quartz, sapphire, graphite, graphene, metal foil, PEN (poly ethylene naphthalate), PET (poly ethylene terephthalate), and combinations thereof.

8. The method of claim 1, wherein the forming of the transition metal layer comprises depositing a tungsten (W) metal layer on the substrate, and
    the injecting of the chalcogenide-containing gas comprises introducing hydrogen sulfide (H$_2$S) in argon (Ar) plasma at 10 sccm to 30 sccm.

9. The method of claim 1, wherein the obtained octahedral transition metal dichalcogenide has a stabilized crystalline structure such that the Raman Spectroscopy remains substantially unchanged after exposure to 1,000 cycles.

10. The method of claim 1, wherein the plasma treatment ionizes the chalcogenide-containing gas and accelerates the ionized chalcogenide-containing gas toward the substrate.

11. The method of claim 1, wherein the plasma treatment is plasma enhanced chemical vapor deposition that applies a plasma power and a plasma duration sufficient to convert the chalcogenide-containing gas into plasma.

12. A method of producing an octahedral transition metal dichalcogenide, comprising:
    depositing a tungsten (W) metal layer on a substrate; and
    injecting a chalcogenide-containing gas onto the substrate with a plasma treatment to form an octahedral transition metal dichalcogenide layer on the tungsten (W) metal layer,
    wherein the chalcogenide-containing gas forms argon ions (Ar$^+$) and hydrogen sulfide ions (H$_2$S$^+$) during the plasma treatment; and
    the injecting of the chalcogenide-containing gas is performed at a temperature in a range of 100° C. to 200° C.

13. The method of claim 12, wherein the depositing of the tungsten (W) metal layer is performed by electron-beam evaporation.

14. The method of claim 12, wherein the transition metal dichalcogenide layer is formed by a plasma enhanced chemical vapor deposition method while the chalcogenide-containing gas is injected at the temperature in the range of 100° C. to 200° C.

15. The method of claim 12, wherein the injecting of the chalcogenide-containing gas comprises introducing hydrogen sulfide ($H_2S$) in argon (Ar) plasma such that the hydrogen sulfide ions ($H_2S^+$) bond to tungsten (W) atoms of the tungsten (W) metal layer, generating hydrogen gas as a by-product.

* * * * *